US009923031B2

(12) United States Patent
Gao et al.

(10) Patent No.: US 9,923,031 B2
(45) Date of Patent: Mar. 20, 2018

(54) ORGANIC LIGHT-EMITTING DIODE ARRAY SUBSTRATE AND DISPLAY APPARATUS

(71) Applicant: BOE TECHNOLOGY GROUP CO., LTD., Beijing (CN)

(72) Inventors: Xinwei Gao, Beijing (CN); Na Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/770,609

(22) PCT Filed: Oct. 31, 2014

(86) PCT No.: PCT/CN2014/090025
§ 371 (c)(1),
(2) Date: Aug. 26, 2015

(87) PCT Pub. No.: WO2016/015395
PCT Pub. Date: Feb. 4, 2016

(65) Prior Publication Data
US 2016/0365389 A1 Dec. 15, 2016

(30) Foreign Application Priority Data
Jul. 30, 2014 (CN) .......................... 2014 1 0370766

(51) Int. Cl.
*H01L 29/08* (2006.01)
*H01L 27/32* (2006.01)
(Continued)

(52) U.S. Cl.
CPC ........ *H01L 27/3209* (2013.01); *C09K 11/025* (2013.01); *C09K 11/06* (2013.01);
(Continued)

(58) Field of Classification Search
CPC .................................................. H01L 27/3209
(Continued)

(56) References Cited

U.S. PATENT DOCUMENTS 9,099,675 B2    8/2015   Ito
2004/0239237 A1 12/2004  Matsusue
(Continued)

FOREIGN PATENT DOCUMENTS

CN    101911335 A    12/2010
CN    102214798 A    10/2011
(Continued)

OTHER PUBLICATIONS

First Chinese Office Action dated Jul. 27, 2016; Appln. No. 201410370766.9.
(Continued)

*Primary Examiner* — Ajay K Arora
(74) *Attorney, Agent, or Firm* — Ladas & Parry LLP

(57) ABSTRACT

An organic light-emitting diode (OLED) array substrate and a display apparatus are provided. The OLED array substrate includes a plurality of OLEDs; the OLED includes an anode, a light-emitting layer and a cathode which are provided sequentially; the light-emitting layers are divided into a plurality of types by color (that is, the light-emitting layers are configured for emitting light of a plurality of colors), and are made of a host material and a guest material doped in the host material; and the OLED further includes an exciton blocking layer provided between the cathode and the light-emitting layer and in contact with the light-emitting layer, which is made of a host material of one light-emitting layer, and the host material of the one light-emitting layer has the biggest highest occupied molecular orbital energy level and the biggest triplet state energy level in the host materials of all light-emitting layers.

20 Claims, 1 Drawing Sheet

(51) Int. Cl.
*C09K 11/02* (2006.01)
*C09K 11/06* (2006.01)
*H01L 51/50* (2006.01)
*H01L 51/52* (2006.01)
*H01L 51/00* (2006.01)

(52) U.S. Cl.
CPC ...... *H01L 27/3211* (2013.01); *H01L 51/5004* (2013.01); *H01L 51/5016* (2013.01); *H01L 51/5072* (2013.01); *H01L 51/5088* (2013.01); *H01L 51/5096* (2013.01); *H01L 51/5281* (2013.01); *H01L 51/0067* (2013.01); *H01L 2251/5376* (2013.01); *H01L 2251/552* (2013.01); *H01L 2251/558* (2013.01)

(58) Field of Classification Search
USPC .......................................................... 257/40
See application file for complete search history.

(56) References Cited

U.S. PATENT DOCUMENTS

| | | | |
|---|---|---|---|
| 2007/0015006 A1* | 1/2007 | Lee | C09K 11/06 428/690 |
| 2009/0121621 A1 | 5/2009 | D'Andrade | |
| 2009/0121624 A1* | 5/2009 | D'Andrade | H01L 51/0025 313/504 |
| 2011/0260145 A1* | 10/2011 | Omary | C07D 401/04 257/40 |
| 2013/0194477 A1* | 8/2013 | Ito | G03G 15/04054 348/333.01 |
| 2014/0008639 A1 | 1/2014 | Thompson et al. | |

FOREIGN PATENT DOCUMENTS

| | | |
|---|---|---|
| CN | 103227188 A | 7/2013 |
| JP | 2013-157278 A | 8/2013 |

OTHER PUBLICATIONS

Internationl Search Report & Written Opinion of the International Searching Authority Appln. No. PCT/CN2014/090025; dated Apr. 27, 2015.
The Third Chinese Office Action dated May 31, 2017; Appln No. 201410370766.9.
Second Chinese Office Action dated Jan. 3, 2017; Appln. No. 201410370766.9.
The Final Chinese Office Action dated Oct. 10, 2017; Appln. 201410370766.9.

* cited by examiner

ORGANIC LIGHT-EMITTING DIODE ARRAY SUBSTRATE AND DISPLAY APPARATUS

TECHNICAL FIELD

Embodiments of the present disclosure relate to an organic light-emitting diode (OLED) array substrate and a display apparatus.

BACKGROUND

An organic light-emitting diode (OLED) array substrate comprises a plurality of sub-pixels, and each sub-pixel has an organic light-emitting diode which can emit light of a specific color. FIG. 1 illustrates a structure of an existing organic light-emitting diode comprising an anode 1, a hole injection layer 2 (HIL), a hole transport layer 3 (HTL), a light-emitting layer 4 (EML), an electron transport layer 5 (ETL), an electron injection layer 6 (EIL) and a cathode 7 which are provided on a base substrate 9 (usually made of glass) sequentially.

The light-emitting layer is a core of the organic light-emitting diode, and made of a host material and a guest material doped in the host material. A highest occupied molecular orbital (HOMO) energy level of the host material is greater than a HOMO energy level of the guest material, while a lowest unoccupied molecular orbital (LUMO) energy level of the host material is less than a LUMO energy level of the guest material; and thus, when an electron and a hole are transported to the light-emitting layer, an exciton (an excited state molecule) is generated in the guest material. When the exciton falls back to a ground state, energy is released in a form of light, that is, light is emitted; a color of the light can be controlled by selecting the host material and the guest material.

In the light-emitting layer, the exciton has two excited states, a singlet state and a triplet state; time that a singlet state exciton falls from the excited state back to the ground state is short, so energy can be released in the form of light, and light is emitted; but a process of a triplet state exciton directly falling from the excited state back to the ground state is limited, and a relaxation time is long, so energy may be released in a non-light form (such as thermal energy, vibrational energy, etc.), resulting in lower luminous efficiency; and especially for a fluorescent light-emitting layer, there is no spin-orbit coupling unlike a phosphorescent light-emitting layer, so the triplet state exciton cannot emit light, resulting in that a theoretic luminous efficiency thereof is merely 25% (a generating ratio of the singlet state exciton to the triplet state exciton is 1:3).

Studies show that, the triplet state excitons can quench each other when energy can be released in the form of light, such that a luminous efficiency of the triplet state excitons is improved. In order to realize quenching between the triplet state excitons, it is necessary to add an "exciton blocking layer" in contact with the light-emitting layer in the organic light-emitting diode, and a HOMO energy level and a triplet state energy level of the layer cannot be less than the HOMO energy level and the triplet state energy level of the host material of the light-emitting layer; in this way, the triplet state excitons are limited in the light-emitting layer, the possibility of quenching among the triplet state excitons is increased, and the luminous efficiency is improved.

Inventors find that there are at least such problems in the prior art as follows: in an organic light-emitting diode array substrate, many layers are formed by a vapor deposition process, and the layers of different materials are fabricated by different vapor deposition devices (e.g., a vapor deposition chamber), respectively, so, if an exciton blocking layer is to be added, a corresponding vapor deposition device shall be added too, resulting in complex fabricating device and high cost; if no exciton blocking layer is provided, the luminous efficiency of the organic light-emitting diode is relatively low.

SUMMARY

According to one embodiment of the present disclosure, there is provided an organic light-emitting diode array substrate, comprising a plurality of organic light-emitting diodes; each of the organic light-emitting diodes including an anode, a light-emitting layer and a cathode which are provided in this order; the light-emitting layers of the organic light-emitting diodes being configured for emitting light of a plurality of colors, each of the light-emitting layers configured for emitting light of the plurality of colors being made of a host material and a guest material doped in the host material; and the organic light-emitting diode further comprises:

an exciton blocking layer provided between the cathode and the light-emitting layer and in contact with the light-emitting layer, the exciton blocking layer being made of a material same as a host material of one light-emitting layer in the light-emitting layers configured for emitting light of the plurality of colors, and the host material of the one light-emitting layer having the biggest highest occupied molecular orbital energy level and the biggest triplet state energy level among host materials of the light-emitting layers configured for emitting light of the plurality of colors.

There is an exciton blocking layer in the organic light-emitting diode array substrate of the embodiment of the present disclosure, so the possibility of quenching among the triplet state excitons is increased, and a luminous efficiency is improved; meanwhile, the layer is made of a host material of one light-emitting layer (e.g., the host material of a blue light-emitting layer), so an vapor deposition device for fabricating the light-emitting layer can be used, and thus the luminous efficiency can be improved without adding a fabricating device or cost; in addition, for the light-emitting layers of other colors (e.g., a green light-emitting layer and a red light-emitting layer), the exciton blocking layer also can play a role of a "hole blocking layer", for balancing carriers transport for holes and electrons, and making the two carriers being better combined and generating excitons in the light-emitting layer, to improve the luminous efficiency of other light-emitting layers.

In one example, a thickness of the exciton blocking layer is between 1 and 50 nanometers.

In one example, the light-emitting layers are divided into a red light-emitting layer, a green light-emitting layer and a blue light-emitting layer; the exciton blocking layer is made of a material same as a host material of the blue light-emitting layer.

In one example, a host material of the green light-emitting layer is same as the host material of the blue light-emitting layer.

In one example, the host material of the blue light-emitting layer may comprises at least one selected from the group consisting of bis(2-methyl-8-quinolinolato-N1,O8)-(1,1'-biphenyl-4-olato) aluminum, 1,3,5-tris(1-phenyl-1H-benzimidazol-2-yl) benzene, 4,7-diphenyl-1,10-phenanthroline, 2,9-dimethyl-4,7-diphenyl-1,10-phenanthroline, and 3-(biphenyl-4-yl)-5-(4-tert-butylphenyl)-4-phenyl-4H-1,2,4-triazole.

In one example, the blue light-emitting layer is a fluorescent light-emitting layer.

In one example, the red light-emitting layer and the green light-emitting layer are phosphorescent light-emitting layers.

In one example, the organic light-emitting diode further includes: a hole transport layer provided between the anode and the light-emitting layer; and an electron transport layer provided between the cathode and the exciton blocking layer.

In one example, the organic light-emitting diode further includes: a hole injection layer provided between the hole transport layer and the anode; and an electron injection layer provided between the electron transport layer and the cathode.

According to another embodiment of the present disclosure, there is provided a display apparatus, comprising the organic light-emitting diode array substrate described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
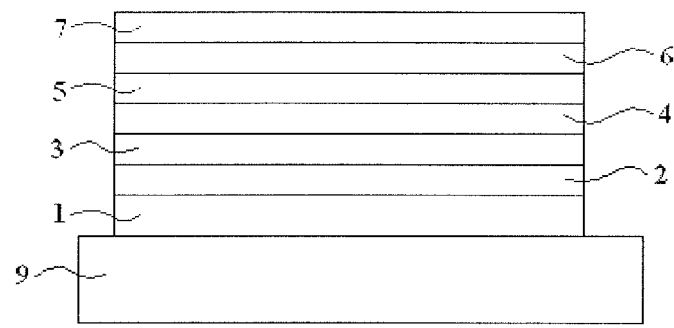
FIG. 1 is a cross-sectional structural schematic diagram of an organic light-emitting diode in an existing organic light-emitting diode array substrate.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

According to some embodiments of the present disclosure, there is provided an organic light-emitting diode array substrate, comprising a plurality of organic light-emitting diodes, each of the organic light-emitting diodes including an anode, a light-emitting layer and a cathode which are provided in this order. The light-emitting layers of the OLEDs are divided into light-emitting layers of a plurality of colors (that is, are configured for emitting light of a plurality of colors), and each of the light-emitting layers is made of a host material and a guest material doped in the host material.

The organic light-emitting diode further comprises: an exciton blocking layer provided between the cathode and the light-emitting layer and in contact with the light-emitting layer, which is made of a host material of one light-emitting layer, and the host material having the biggest highest occupied molecular orbital energy level and the biggest triplet state energy level among the host materials of all light-emitting layers. That is to say, the exciton blocking layer is made of a material same as the host material of one of the light-emitting layers configured for emitting light of the plurality of colors, which has the biggest highest occupied molecular orbital energy level and the biggest triplet state energy level.

There is an exciton blocking layer in the organic light-emitting diode array substrate according to the embodiment of the present disclosure, so the possibility of quenching among the triplet state excitons is increased, and a luminous efficiency is improved; meanwhile, the layer is made of a host material of one light-emitting layer (e.g., the host material of a blue light-emitting layer), so an vapor deposition device for fabricating the light-emitting layer can be used, and thus the luminous efficiency is improved without adding a fabricating device or cost; in addition, for the light-emitting layers of other colors (e.g., a green light-emitting layer and a red light-emitting layer), the exciton blocking layer also can play a role of a "hole blocking layer", for balancing carriers transport for holes and electrons, and making the two carriers being better combined and generating excitons in the light-emitting layer, to improve luminous efficiencies of other light-emitting layers.

For example, the anode, the light-emitting layer and the cathode of the organic light-emitting diode are stacked on a base substrate in such a sequence or in a reverse sequence.

In some examples, a thickness of the exciton blocking layer is between 1 and 50 nanometers.

Studies show that, the exciton blocking layer in the above thickness range can improve the luminous efficiency, and cause no adverse effect on other performances of the organic light-emitting diode.

For example, for the light-emitting layers configured for emitting light of the plurality of colors, the highest occupied molecular orbital (HOMO) energy level of the host material is greater than the HOMO energy level of the guest material, while the lowest unoccupied molecular orbital (LUMO) energy level of the host material is less than the LUMO energy level of the guest material.

For example, the light-emitting layers of the OLEDs are divided into a red light-emitting layer, a green light-emitting layer and a blue light-emitting layer; and the exciton blocking layer is made of the host material of the blue light-emitting layer.

A tri-color mode of red, green and blue (RGB mode) is the most frequently-used mode in display, in the light-emitting layers of the three colors, the HOMO energy level and triplet energy level of the host material of the blue light-emitting layer are often greater than or equal to those of the host materials of the other two light-emitting layers, so in this case, an exciton blocking layer can be made of the host material of the blue light-emitting layer.

In some examples, the host material of the green light-emitting layer is the same as the host material of the blue light-emitting layer.

That is to say, the green light-emitting layer can adopt the same host material as the blue light-emitting layer (of course, the guest material is different), further simplifying a preparation device and process. The red light-emitting layer can also adopt the same host material as the blue light-emitting layer in theory, but it is difficult to carry out.

In some examples, the host material of the blue light-emitting layer includes at least one selected from the group consisting of bis(2-methyl-8-quinolinolato-N1,O8)-(1,1'-biphenyl-4-olato) aluminum, 1,3,5-tris(1-phenyl-1H-benzimidazol-2-yl) benzene, 4,7-diphenyl-1,10-phenanthroline, 2,9-dimethyl-4,7-diphenyl-1,10-phenanthroline, and 3-(biphenyl-4-yl)-5-(4-tert-butylphenyl)-4-phenyl-4H-1,2,4-triazole.

Studies show that, the above materials are relatively applicable to serving as the host material of the blue light-emitting layer in the embodiments of the present disclosure in various aspects, such as conductibility, energy level, hole and electron transport performance and so on.

In some examples, the blue light-emitting layer is a fluorescent light-emitting layer. In some examples, the red light-emitting layer and the green light-emitting layer are phosphorescent light-emitting layers.

As described above, the phosphorescent light-emitting layer has higher luminous efficiency than the fluorescent light-emitting layer, so the red light-emitting layer and the green light-emitting layer are preferably a phosphorescent light-emitting layer; since the blue phosphorescent light-emitting layer has some problems in terms of service life and color purity, which is difficult to be actually applied, the blue light-emitting layer is preferably a fluorescent light-emitting layer.

In some examples, the organic light-emitting diode further includes: a hole transport layer provided between the anode and the light-emitting layer; and an electron transport layer provided between the cathode and the exciton blocking layer. Preferably, the organic light-emitting diode further includes: a hole injection layer provided between the hole transport layer and the anode; and an electron injection layer provided between the electron transport layer and the cathode.

Each of the above layers can improve transport of electrons and holes, so as to further improve the performance of the organic light-emitting diode.

Figure 2:
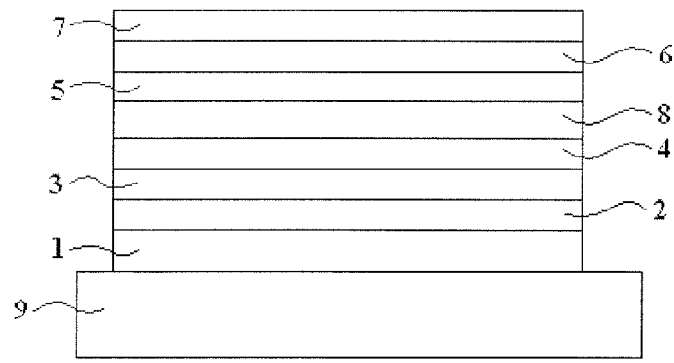
FIG. 2 is a cross-sectional structural schematic diagram of an organic light-emitting diode in an organic light-emitting diode array substrate provided by Embodiment 2 of the present disclosure.
Figure 3:
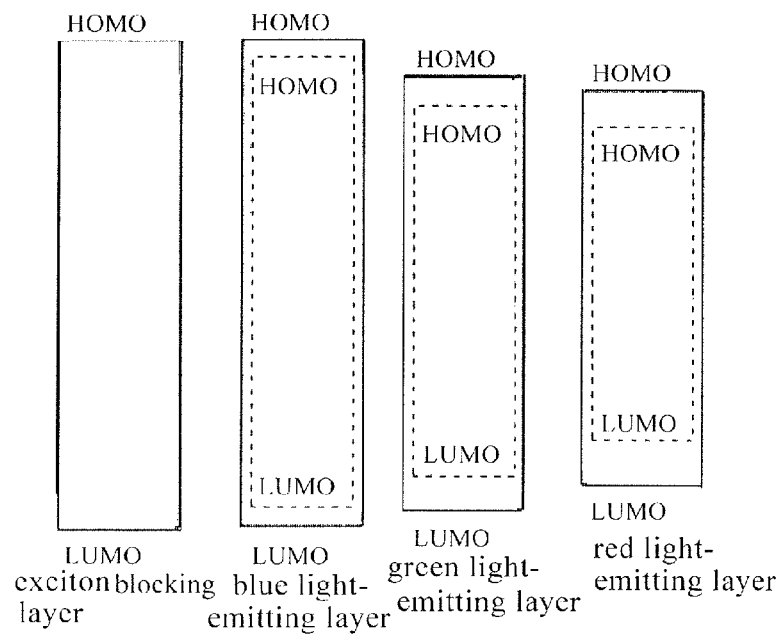
FIG. 3 is a comparison schematic diagram of energy levels of part of layers of the organic light-emitting diode in the organic light-emitting diode array substrate provided by Embodiment 2 of the present disclosure.

As illustrated in FIG. 2 and FIG. 3, some embodiments of the present disclosure provide an organic light-emitting diode array substrate.

The organic light-emitting diode array substrate comprises a plurality of sub-pixels, and each sub-pixel has an organic light-emitting diode; wherein the sub-pixels are divided into three types by color: a red sub-pixel, a green sub-pixel and a blue sub-pixel, that is, the organic light-emitting diodes in the sub-pixels are divided into three type by color: a red light-emitting diode, a green light-emitting diode and a blue light-emitting diode, too.

For example, as illustrated in FIG. 2, an organic light-emitting diode is provided on a base substrate 9 (often made of glass), and in a direction away from the base substrate 9, sequentially includes the following layers.

(1) An anode 1, which is made of transparent Indium Tin Oxide (ITO) material, having a thickness of 130 nm.

(2) A hole injection layer 2, which is made of 4,4',4"-tris (N-3-methylphenyl-N-phenylamino) triphenylamine (m-MTDATA, a HOMO energy level is 5.1 eV, and a LUMO energy level is 2.0 eV), having a thickness of 65 nm.

(3) A hole transport layer 3, which is made of N, N'-di-[(1-naphthalenyl)-N,N'-diphenyl]-1,1'-biphenyl)-4,4'-diamine (NPB, the HOMO energy level is 5.4 eV, and the LUMO energy level is 2.4 eV), having a thickness of 20 nm.

(4) A light-emitting layer 4, wherein, for an organic light-emitting diode configured for emitting light of a specific color, the light-emitting layer 4 therein is also configured for emitting light of the corresponding color.

The green organic light-emitting diode has a green light-emitting layer 4, and the host material thereof is Green Host1 (the HOMO energy level is 5.39 eV, the LUMO energy level is 1.95 eV and a triplet energy level is 2.38 eV), the guest material is Green Dopant1 (the HOMO energy level is 5.14 eV, the LUMO energy level is 2.74 eV and the triplet energy level is 2.36 eV, a percentage of dopant is 3%), having a thickness of 30 nm.

The red organic light-emitting diode has a red light-emitting layer 4, and the host material thereof is Red Host1 (the HOMO energy level is 5.4 eV, the LUMO energy level is 2.8 eV and the triplet energy level is 2.2 eV), the guest material is Red Dopant1 (the HOMO energy level is 5.1 eV, the LUMO energy level is 3.1 eV and the triplet energy level is 2 eV, the percentage of dopant is 4%), having a thickness of 40 nm.

The blue organic light-emitting diode has a blue light-emitting layer 4, and the host material thereof is 3-(biphenyl-4-yl)-5-(4-tert-butylphenyl)-4-phenyl-4H-1,2,4-triazole (TAZ, the HOMO energy level is 6.4 eV, the LUMO energy level is 2.8 eV and the triplet energy level is 2.55), the guest material is Blue Dopant1 (the HOMO energy level is 5.6 eV, the LUMO energy level is 2.4 eV and the triplet energy level is 2.5 eV, the percentage of dopant is 2%), having a thickness of 20 nm.

Green Host1, Green Dopant1, Red Host1, Red Dopant1 and Blue Dopant1 are names for commercially available products of the host materials and guest materials of light-emitting layers, all of which are regular materials, so specific compositions thereof need not to be limited here. It should be understood that, those skilled in the art also can select other known substances or products as the host materials or guest materials of these light-emitting layers.

(5) An exciton blocking layer 8: no matter what color of the organic light-emitting diode is, the material of the exciton barrier layer 8 thereof is the same as the host material of the blue light-emitting layer 4, and both the host materials are 3-(biphenyl-4-yl)-5-(4-tert-butylphenyl)-4-phenyl-4H-1,2,4-triazole (TAZ, the HOMO energy level is 6.4 eV, the LUMO energy level is 2.8 eV and the triplet energy level is 2.55), having a thickness of 10 nm.

FIG. 3 illustrates a relationship of the HOMO energy levels and LUMO energy levels between the exciton blocking layer 8 and the light-emitting layers 4 of respective colors in the present embodiment. A higher the position means a higher the energy level; a solid line frame represents the energy level of the host material, and a dash line frame represents the energy level of the guest material. It can be seen that, due to the same material, the host materials of the exciton blocking layer 8 and the blue light-emitting layer 4 have the same HOMO energy level, which is higher than the HOMO energy levels of the green light-emitting layer 4 and the red light-emitting layer 4, thus ensuring that the exciton blocking layer 8 can play a role for blocking excitons.

(6) An electron transport layer 5, which is made of bis (2-methyl-8-quinolinolato-N1,O8)-(1,1'-Biphenyl-4-olato) aluminum (BAlq, the HOMO energy level is 5.9 eV, the LUMO energy level is 2.9 eV), having a thickness of 20 nm.

(7) An electron injection layer 6, which is made of lithium fluoride (LiF), having a thickness of 1.5 nm.

(8) A cathode 7, which is made of aluminum, having a thickness of 80 nm.

The cathode 7 is thicker, so it has stronger reflectivity, which can reflect light irradiated thereon to be emitted from the base substrate 9, and therefore, the organic light-emitting diode of the embodiment is of a bottom-emitting type.

The anodes 1 of the respective organic light-emitting diodes should be independent of each other, so that light-emitting brightness of the respective organic light-emitting diodes can be separately controlled; light-emitting layers 4 configured for emitting light of different colors are made of different materials, so they should be independent of each other; and oppositely, in order to facilitate fabricating, the other layers of different organic light-emitting diodes can be connected integrally.

In a maximum gray scale, the light-emitting brightness of the organic light-emitting diodes configured for emitting light of all colors in the organic light-emitting diode array substrate according to the embodiment is tested, obtaining that the light-emitting brightness of the green organic light-emitting diode is 27 cd/A, the light-emitting brightness of the red organic light-emitting diode is 14 cd/A and the light-emitting brightness of the blue organic light-emitting diode is 7.5 cd/A.

Correspondingly, in the maximum gray scale, the light-emitting brightness of the organic light-emitting diodes of respective colors in the organic light-emitting diode array substrate (which differs from this embodiment only in having no exciton blocking layer 8 therein) according to a comparison embodiment is tested, obtaining that the light-emitting brightness of the green organic light-emitting diode is 27 cd/A, the light-emitting brightness of the red organic light-emitting diode is 12 cd/A and the light-emitting brightness of the blue organic light-emitting diode is 7 cd/A.

It can be seen that, after an exciton blocking layer 8 is added, luminous efficiencies of the green organic light-emitting diode, the red organic light-emitting diode and the blue organic light-emitting diode are improved by 28%, 16% and 7%, respectively, that is to say, by providing the exciton blocking layer 8, light-emitting efficiencies of organic light-emitting diodes of respective colors in the organic light-emitting diode array substrate can be significantly improved; meanwhile, since the exciton blocking layer 8 is made of the host material of the blue light-emitting layer 4, an vapor deposition device for preparing the blue light-emitting layer 4 can be used; in this way, there is no need to add a new device, and the cost is low.

As illustrated in FIG. 2, according to some embodiments of the present disclosure, there is provided an organic light-emitting diode array substrate.

The organic light-emitting diode array substrate comprises a plurality of sub-pixels, and each sub-pixel has an organic light-emitting diode; wherein the sub-pixels are divided into three types by color: a red sub-pixel, a green sub-pixel and a blue sub-pixel, that is, the organic light-emitting diodes in the sub-pixels are divided into three types by color: a red light-emitting diode, a green light-emitting diode and a blue light-emitting diode, too.

Specifically, as illustrated in FIG. 2, each organic light-emitting diode is provided on a base substrate 9 (often made of glass), and in a direction away from the base substrate 9, the organic light-emitting diode sequentially includes the following layers.

(1) An anode 1, which is made of transparent Indium Tin Oxide (ITO) material, having a thickness of 15 nm; and a metal reflecting layer (e.g., a sliver reflecting layer) being further provided on a side of the anode close to the base substrate 9.

The reflecting layer is provided because the organic light-emitting diode array substrate is of a top-emitting type, i.e., light emitted by the light-emitting layer 4 is emitted from a cathode 7 after reflection.

(2) A hole injection layer 2, which is made of 4,4',4"-tris (N-3-methylphenyl-N-phenylamino) triphenylamine (m-MTDATA, a HOMO energy level is 5.1 eV, and a LUMO energy level is 2.0 eV), having a thickness of 70 nm.

(3) A hole transport layer, which is made of N,N'-di-[(1-naphthalenyl)-N,N'-diphenyl]-1,1'-biphenyl)-4,4'-diamine (NPB, the HOMO energy level is 5.4 eV, and the LUMO energy level is 2.4 eV); the hole transport layers 3 of organic light-emitting diodes configured for emitting light of different colors have different thicknesses: the hole transport layer 3 of the green organic light-emitting diode has a thickness of 35 nm, the hole transport layer 3 of the red organic light-emitting diode has a thickness of 45 nm, and the hole transport layer 3 of the blue organic light-emitting diode has a thickness of 15 nm.

In the organic light-emitting diode array substrate of a top-emitting type, light emitted by the light-emitting layer 4 can be emitted after repeatedly vibrating in a resonant chamber between the cathode 7 and the anode 1, and a wavelength of the emitted light is related to a thickness of the resonant chamber; therefore, the resonant chambers in the organic light-emitting diodes of different colors should have different thicknesses to match the wavelength range of the light emitted with the color better; comprehensively considering conductibility, preparation difficulty and other aspects, the thickness of the resonant chamber is usually adjusted by adjusting the thickness of the hole transport layer 3, so the hole transport layers 3 in the organic light-emitting diodes configured for emitting light of different colors should have different thicknesses.

(4) A light-emitting layer 4, wherein the light-emitting layers 4 of the organic light-emitting diodes configured for emitting different colors are also configured for emitting light of the corresponding colors.

The green organic light-emitting diode has a green light-emitting layer 4, and the host material thereof is Green Host1 (the HOMO energy level is 5.39 eV, the LUMO energy level is 1.95 eV and a triplet energy level is 2.38 eV), the guest material is Green Dopant1 (the HOMO energy level is 5.14 eV, the LUMO energy level is 2.74 eV and the triplet energy level is 2.36 eV, a percentage of dopant is 3%), having a thickness of 30 nm.

The red organic light-emitting diode has a red light-emitting layer 4, and the host material thereof is Red Host1 (the HOMO energy level is 5.4 eV, the LUMO energy level is 2.8 eV and the triplet energy level is 2.2 eV), the guest material is Red Dopant1 (the HOMO energy level is 5.1 eV, the LUMO energy level is 3.1 eV and the triplet energy level is 2 eV, the percentage of dopant is 4%), having a thickness of 40 nm.

The blue organic light-emitting diode has a blue light-emitting layer 4, and the host material thereof is 3-(Biphenyl-4-yl)-5-(4-tert-butylphenyl)-4-phenyl-4H-1,2,4-triazole (TAZ, the HOMO energy level is 6.4 eV, the LUMO energy level is 2.8 eV and a triplet energy level is 2.55), the guest material is Blue Dopant1 (the HOMO energy level is 5.6 eV, the LUMO energy level is 2.4 eV and the triplet energy level is 2.5 eV, the percentage of dopant is 2%), having a thickness of 20 nm.

(5) An exciton blocking layer 8: no matter what color of the organic light-emitting diode is, the material of the exciton barrier layer 8 thereof is the same as the host material of the blue light-emitting layer 4, and both the host materials are 3-(biphenyl-4-yl)-5-(4-tert-butylphenyl)-4-phenyl-4H-1,2,4-triazole (TAZ, the HOMO energy level is 6.4 eV, the LUMO energy level is 2.8 eV and the triplet energy level is 2.55), having a thickness of 10 nm.

(6) An electron transport layer 5, which is made of bis (2-methyl-8-quinolinolato-N1,O8)-(1,1'-Biphenyl-4-olato) aluminum (BAlq, the HOMO energy level is 5.9 eV, the LUMO energy level is 2.9 eV), having a thickness of 20 nm.

(7) An electron injection layer 6, which is made of lithium fluoride (LiF), having a thickness of 1.5 nm.

(8) A cathode 7, which is made of silver-magnesium alloys, having a thickness of 15 nm.

The cathode 7 is thinner, so it is transparent, allowing light to go through; therefore, the organic light-emitting diode array substrate of the embodiment is of a top-emitting type.

The anodes 1 of the respective organic light-emitting diodes should be independent of each other, so that light-emitting brightness of the respective organic light-emitting diodes can be separately controlled; in organic light-emitting diodes configured for emitting light of different colors, the light-emitting layers 4 are made of different materials, and the hole transport layers 3 have different thicknesses, so they should be independent of each other; and relatively speaking, in order to facilitate fabricating, the other layers of different organic light-emitting diodes can be connected integrally.

In a maximum gray scale, the light-emitting brightness of the organic light-emitting diodes configured for emitting light of all colors in the organic light-emitting diode array substrate according to the embodiment is tested, obtaining that the light-emitting brightness of the green organic light-emitting diode is 47 cd/A, the light-emitting brightness of the red organic light-emitting diode is 25 cd/A and the light-emitting brightness of the blue organic light-emitting diode is 5.5 cd/A.

Correspondingly, in the maximum gray scale, the light-emitting brightness of the organic light-emitting diodes of respective colors in the organic light-emitting diode array substrate (which differs from this embodiment only in having no exciton blocking layer 8 therein) according to a comparison embodiment is tested, obtaining that the light-emitting brightness of the green organic light-emitting diode is 38 cd/A, the light-emitting brightness of the red organic light-emitting diode is 21 cd/A and the light-emitting brightness of the blue organic light-emitting diode is 5 cd/A.

It can be seen that, after an exciton blocking layer 8 is added, luminous efficiencies of the green organic light-emitting diode, the red organic light-emitting diode and the blue organic light-emitting diode are improved by 23%, 19% and 10%, respectively, that is to say, by providing the exciton blocking layer 8, light-emitting efficiencies of organic light-emitting diodes of respective colors in the organic light-emitting diode array substrate can be significantly improved; meanwhile, since the exciton blocking layer 8 is made of the host material of the blue light-emitting layer 4, an vapor deposition device for preparing the blue light-emitting layer 4 can be used; in this way, there is no need to add a new device, and the cost is low.

Of course, the organic light-emitting diode array substrate according to the above embodiments may further comprise a lot of other structures, for example, a driving circuit for driving respective organic light-emitting diodes to emit light, a gate line, and a data line; because such structures can be in known forms, which need not to be described in detail here.

It should be understood that, the above embodiments have a lot of variations.

For example, the above embodiments take the light-emitting layers divided into three types by color: a red light-emitting diode, a green light-emitting diode, a blue light-emitting diode for example, but the light-emitting layers may comprises light-emitting diode configured for emitting light of other colors (e.g., a yellow light-emitting layer), no matter how many colors of the light-emitting layer, an exciton blocking layer must be made of a host material of the light-emitting layer having the biggest HOMO energy level and the biggest triplet energy level.

As another example, a hole injection layer, a hole transport layer, an electron injection layer and an electron transport layer in an organic light-emitting diode mainly play a role for improving transporting of holes and electrons, so one or more of these layers can be omitted.

As another example, specific materials and thicknesses of the layers can be modified by those skilled in the art according to demands.

In addition, respective layers of the organic light-emitting diode are stacked on a base substrate in the sequence illustrated in FIG. 2, however the embodiments of the present disclosure are not limited thereto, or the layers may be stacked on the base substrate in a sequence reverse to the sequence as illustrated in FIG. 2.

According to some embodiments of the present disclosure, there is provided a display apparatus, comprising any one of the organic light-emitting diode array substrates described above, and the display apparatus may be an OLED panel, electronic paper, a mobile phone, a tablet computer, a television, a monitor, a laptop computer, a digital photo frame, a navigator, or any other product or component having a display function.

The foregoing embodiments merely are exemplary embodiments of the disclosure, and not intended to define the scope of the disclosure, and the scope of the disclosure is determined by the appended claims.

The present application claims priority of Chinese Patent Application No. 201410370766.9 filed on Jul. 30, 2014, the disclosure of which is incorporated herein by reference in its entirety as part of the present application.

The invention claimed is:

1. An organic light-emitting diode (OLED) array substrate, comprising a plurality of OLEDs, each of the OLEDs including an anode, a light-emitting layer and a cathode which are provided in this order, the light-emitting layers of the OLEDs being configured for emitting light of a plurality of colors, each of the light-emitting layers configured for emitting light of the plurality of colors being made of a host material and a guest material doped in the host material, wherein each of the OLEDs further includes:
    an exciton blocking layer provided between the cathode and the light-emitting layer and in contact with the light-emitting layer, the exciton blocking layer being made of a material same as a host material of one light-emitting layer in the light-emitting layers configured for emitting light of the plurality of colors, and the host material of the one light-emitting layer having a biggest highest occupied molecular orbital energy level and a biggest triplet state energy level among host materials of the light-emitting layers configured for emitting light of the plurality of colors.

2. The OLED array substrate according to claim 1, wherein
    the exciton blocking layer has a thickness from 1 nm to 50 nm.

3. The OLED array substrate according to claim 1, wherein
    the light-emitting layers of the OLEDs are divided into a red light-emitting layer, a green light-emitting layer and a blue light-emitting layer;
    the exciton blocking layer is made of a material same as a host material of the blue light-emitting layer.

4. The OLED array substrate according to claim 3, wherein the green light-emitting layer and the blue light-emitting layer have a same host material.

5. The OLED array substrate according to claim 3, wherein the host material of the blue light-emitting layer comprises at least one selected from the group consisting of bis(2-methyl-8-quinolinolato-N1,O8)-(1,1'-biphenyl-4-olato) aluminum, 1,3,5-tris(1-phenyl-1H-benzimidazol-2-yl) benzene, 4,7-diphenyl-1,10-phenanthroline, 2,9-dimethyl-4,7-diphenyl-1,10-phenanthroline, and 3-(biphenyl-4-yl)-5-(4-tert-butylphenyl)-4-phenyl-4H-1,2,4-triazole.

6. The OLED array substrate according to claim 3, wherein
the blue light-emitting layer is a fluorescent light-emitting layer.

7. The OLED array substrate according to claim 3, wherein the red light-emitting layer and the green light-emitting layer are phosphorescent light-emitting layers.

8. The OLED array substrate according to claim 1, wherein each of the OLEDs further comprises:
a hole transport layer provided between the anode and the light-emitting layer; and
an electron transport layer provided between the cathode and the exciton blocking layer.

9. The OLED array substrate according to claim 8, wherein each of the OLEDs further includes:
a hole injection layer provided between the hole transport layer and the anode; and
an electron injection layer provided between the electron transport layer and the cathode.

10. A display apparatus, comprising:
the OLED array substrate according to claim 1.

11. The OLED array substrate according to claim 2, wherein
the light-emitting layers of the OLEDs are divided into a red light-emitting layer, a green light-emitting layer and a blue light-emitting layer;
the exciton blocking layer is made of a material same as a host material of the blue light-emitting layer.

12. The OLED array substrate according to claim 2, wherein each of the OLEDs further comprises:
a hole transport layer provided between the anode and the light-emitting layer; and
an electron transport layer provided between the cathode and the exciton blocking layer.

13. The display apparatus according to claim 10, wherein the exciton blocking layer has a thickness from 1 nm to 50 nm.

14. The display apparatus according to claim 10, wherein the light-emitting layers of the OLEDs are divided into a red light-emitting layer, a green light-emitting layer and a blue light-emitting layer;
the exciton blocking layer is made of a material same as a host material of the blue light-emitting layer.

15. The display apparatus according to claim 14, wherein the green light-emitting layer and the blue light-emitting layer have a same host material.

16. The display apparatus according to claim 14, wherein the host material of the blue light-emitting layer comprises at least one selected from the group consisting of bis(2-methyl-8-quinolinolato-N1,O8)-(1,1'-biphenyl-4-olato) aluminum, 1,3,5-tris(1-phenyl-1H-benzimidazol-2-yl) benzene, 4,7-diphenyl-1,10-phenanthroline, 2,9-dimethyl-4,7-diphenyl-1,10-phenanthroline, and 3-(biphenyl-4-yl)-5-(4-tert-butylphenyl)-4-phenyl-4H-1,2,4-triazole.

17. The display apparatus according to claim 14, wherein the blue light-emitting layer is a fluorescent light-emitting layer.

18. The display apparatus according to claim 14, wherein the red light-emitting layer and the green light-emitting layer are phosphorescent light-emitting layers.

19. The display apparatus according to claim 10, wherein each of the OLEDs further comprises:
a hole transport layer provided between the anode and the light-emitting layer; and
an electron transport layer provided between the cathode and the exciton blocking layer.

20. The display apparatus according to claim 19, wherein each of the OLEDs further includes:
a hole injection layer provided between the hole transport layer and the anode; and
an electron injection layer provided between the electron transport layer and the cathode.

* * * * *